(12) United States Patent
Kosmowski

(10) Patent No.: US 7,443,179 B2
(45) Date of Patent: Oct. 28, 2008

(54) ZERO MOTION CONTACT ACTUATION

(75) Inventor: Mark Kosmowski, Beaverton, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 86 days.

(21) Appl. No.: 11/565,406

(22) Filed: Nov. 30, 2006

(65) Prior Publication Data

US 2008/0129310 A1    Jun. 5, 2008

(51) Int. Cl.
G01R 1/067    (2006.01)

(52) U.S. Cl. .......................... 324/754; 324/757

(58) Field of Classification Search ......... 324/754–765, 324/158.1
See application file for complete search history.

(56) References Cited

U.S. PATENT DOCUMENTS

| | | | |
|---|---|---|---|
| 3,915,850 A * | 10/1975 | Crownover ................. | 209/560 |
| 4,931,721 A | 6/1990 | Berrigan et al. | |
| 5,034,749 A | 7/1991 | Jungblut et al. | |
| 5,057,772 A | 10/1991 | Bruno et al. | |
| 5,510,719 A | 4/1996 | Yamamoto | |
| 5,673,799 A | 10/1997 | Braden | |
| 5,677,634 A | 10/1997 | Cooke et al. | |
| 6,040,705 A | 3/2000 | Garcia et al. | |
| 6,043,665 A | 3/2000 | Nishioka et al. | |
| 6,100,707 A * | 8/2000 | Baumann et al. ............ | 324/761 |
| 6,198,290 B1 | 3/2001 | Krinker | |
| 6,204,464 B1 * | 3/2001 | Garcia et al. ................ | 209/574 |
| 6,459,707 B1 | 10/2002 | Becker | |
| 6,518,777 B2 | 2/2003 | Kamitani et al. | |
| 6,677,637 B2 | 1/2004 | Bernstein et al. | |
| 6,714,028 B2 | 3/2004 | Garcia et al. | |
| 6,882,015 B2 | 4/2005 | Bernstein et al. | |
| 6,907,363 B1 | 6/2005 | Wyant et al. | |
| 7,030,634 B2 * | 4/2006 | Sasaoka ...................... | 324/757 |
| 7,091,738 B2 * | 8/2006 | Nakano et al. .............. | 324/770 |
| 7,173,432 B2 | 2/2007 | Garcia et al. | |

* cited by examiner

*Primary Examiner*—Ernest F Karlsen
(74) *Attorney, Agent, or Firm*—Young Basile

(57) ABSTRACT

A device for testing small electronic components includes a test plate for moving a plurality of spaced electronic components to a test station. A roller is designed to press on the test plate and electronic component exerting a first force between 10-20 grams when the test plate and electronic component are moving and exerting a second force of about 50 grams when the test plate is stopped and the electronic component is aligned in the test station. The forces exerted on the test plate and electronic component are controlled by a force-application actuator, such as fluid operated actuator, for example a pneumatic actuator or a solenoid.

20 Claims, 4 Drawing Sheets

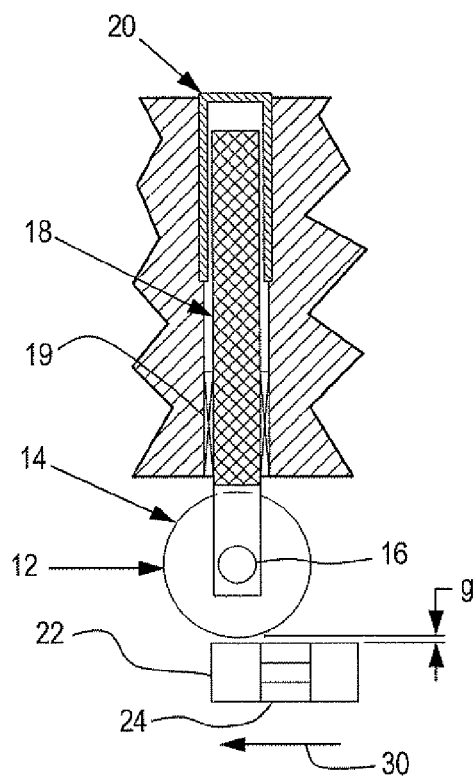
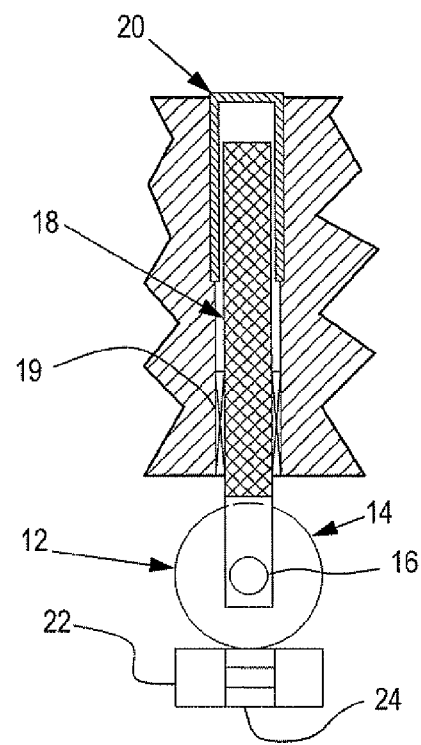
FIG. 1A
PRIOR ART
FIG. 1B
PRIOR ART
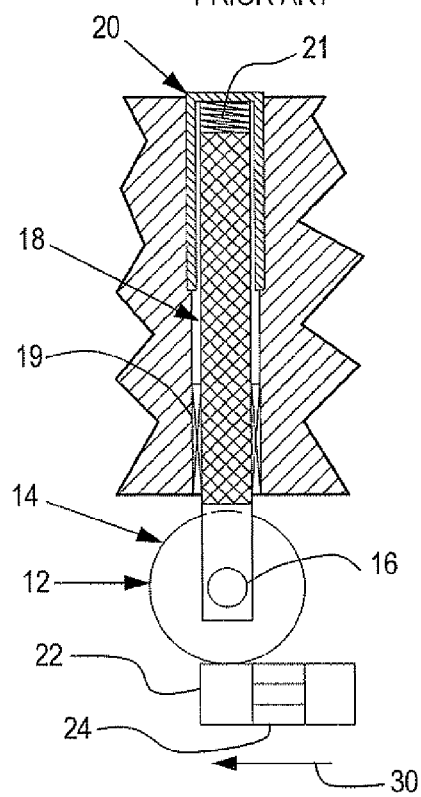
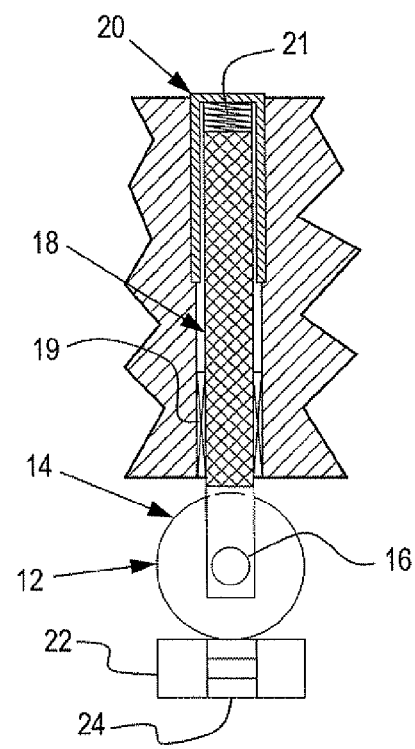
FIG. 3A
FIG. 3B

ZERO MOTION CONTACT ACTUATION

FIELD OF THE INVENTION

The invention pertains to the field of testing equipment of electronic components. More particularly to the field of vertical type electrical contactors that wipe across the termination surface or area of a device under test while making contact therewith.

BACKGROUND

In the field of miniature electronic devices there are miniature capacitors having conductive end terminations that require testing to insure the quality of their electronic capabilities. One type of contactor used to temporarily connect to the conductive ends of the electronic devices for the purpose of electrical measurements includes a contact roller.

The contact roller is made of an electrically conductive metal material that is rotatable on an axis secured to a base plate or framework of the testing machine via spring support. The spring support may vary in length and include springs that continually bias or urge the supports to the maximum lengths. Presently, the contact roller is preloaded to a constant force. As the test plate moves, the spring support urged the roller toward the path surface whereby the roller rolls on and at the same time presses on the surface of the test path. As an electrical component is moved to the test area via a test plate, the roller rolls off the path surface and onto the end of the electronic component. Once the roller is fully pressed into the component, the part is ready for testing. The downward force exerted by the roller on the component during testing is the same predetermined force exerted on the surface of the test pathway as the test plate moves. The required contact force to make a proper test measurement on an electronic component is about 50 grams. However, as the components that are processed get smaller, the resilience of the metal termination of the components diminish to a point where the allowable contact load drops below the required load for stable testing. The maximum allowable force for the smaller electronic components during motion is only about 20 grams. Therefore, additional force placed on a moving electronic component can cause damage to the component.

Another procedure to eliminate damage to the electronic component includes activating the contact roller so that the roller does not touch the surface of the test plate or the electronic component while the test plate is in motion. This procedure requires the contact roller to be retracted from the test plate and component while the test plate is in motion and then extended when the test plate stops and the component is in place for testing.

In this procedure, the contact roller is actuated by a solenoid coil. When the solenoid coil is de-energized, the contact roller is in a raised position above the test plate. Once the test plate stops and an electronic component is in place at the test station for testing, the solenoid coil energizes and lowers the contact roller. The contact roller is preloaded to a 50 gram vertical force on the electronic component to allow for a stable testing environment. The disadvantage of this procedure is that the raising and lowering of the contact roller causes a 5% to 13% decrease in productivity of the testing system.

SUMMARY

It is the intent of the present invention to address the aforementioned concerns.

In one aspect of the invention, a method is provided for testing small electronic components transported along a movable test plate to a test station. The method includes the steps of exerting a first predetermined force on the moving test plate and the moving electronic component, stopping the test plate when the electronic component is at the test station and exerting a second predetermined force on the electronic component when the electronic component is at the station and the test plate is stopped. The second predetermined force on an electronic component is maintained during the testing of the electronic component. After the testing step is completed, the second predetermined force is removed, while the first predetermined force remains exerted on the test plates and the electronic component.

Another aspect of the invention, the invention includes a device for testing electronic components including a transport test plate selectively movable and stoppable for transporting electronic components to a test station, a contact roller secured to and located at the test station for rolling along a surface of a test plate and an electronic component transferred to a test station for testing. The device further includes a contact roller for exerting a first predetermined force on the test plate and an electronic component when the test plate is moving and the contact roller for exerting a second predetermined force on the electronic component when the electronic component is tested.

Other applications of the present invention will become apparent to those skilled in the art when the following description of the best mode contemplated for practicing the invention is read in conjunction with the accompanying drawings.

BRIEF DESCRIPTION OF THE DRAWINGS

The description herein makes reference to the accompanying drawings wherein like reference numerals refer to like parts throughout the several views, and wherein:

FIGS. 1A and 1B are schematic views illustrating a contact roller for contacting a test component at a test station according to the prior art;

FIG. 3A and 3B are schematic views of a contact roller at a test station according to one embodiment of the present invention with a solenoid actuator;

DETAILED DESCRIPTION

Figure 2:
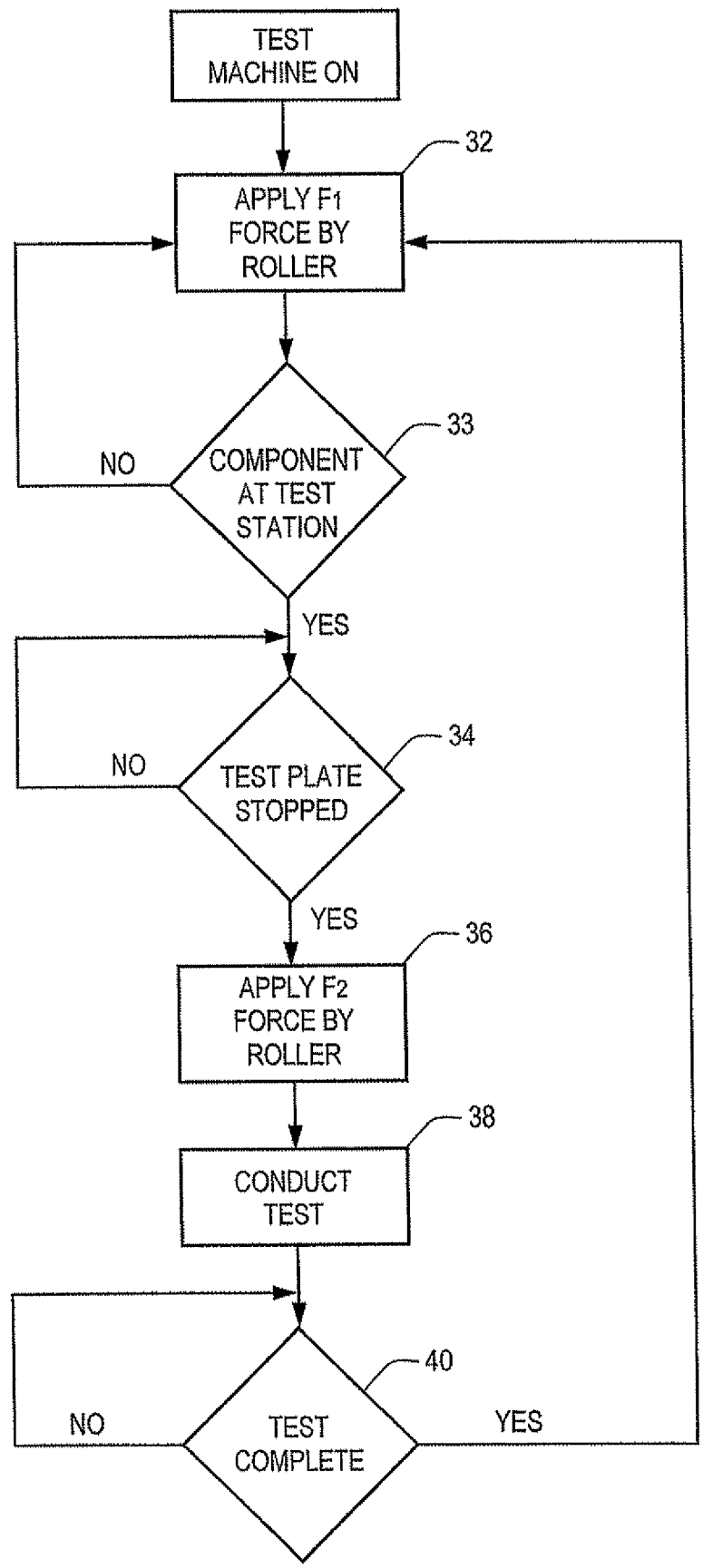
FIG. 2 is a flow chart illustrating the steps for regulating a force from the contact roller to the electrical component.

Referring to the drawings, FIG. 1A, 1B, and 3A, 3B, 4A and 4B elements are identified by numbers and like elements are identified with like numbers throughout the six figures.

A testing apparatus (not shown) can include multiple test stations using a test plate 22 to move spaced individual electronic components from one test station to another for testing. At least one contactor is secured to each test station. At each test station, the component is temporarily secured in place and tested by the contactors. FIG. 1A and 1B show one basic prior art construction of a contactor in the form of contact rollers. The contactors include a contact roller 12 having a circular outer rolling surface 14 supported for concentric rotation about an axle 16 passing through a centralized aperture in the roller 12. The roller 12 is supported by the axle 16 to a magnetized solenoid rod 18 or spring (not shown). The solenoid rod 18 extends through a guide bearing 19 to the axle 16 to provide proper alignment of the contact roller 12. When the solenoid coil 20 is in a de-energized state, the solenoid rod 18 is retracted or is in a raised position relative to the pathway of a test plate 22. The distance (g) of the bottommost surface of the contact roller 12 with respect to the electronic component 24 or the test plate 22 when the test plate 22 is moving typically forms a 0.5 millimeter air gap (FIG. 1A).

When the test plate 22 has stopped and the electronic component 24 is aligned with the contact roller 12 at the test station, the solenoid coil 20 is energized to lower the solenoid rod 18 and roller 14 onto the electronic component 24 for testing; and to further exert a predetermined force, preferably 50 grams onto the testing component 24 to provide a stable testing environment during testing (FIG. 1B). After the test, the solenoid 20 is de-energized and the roller 12 is raised above the test plate 22 and the electronic component 24 before the test plate 22 begins to move. This procedure prevents damage to the electronic component 24. However, the raising and lowering of the contact roller 12 reduces the testing throughput of the electronic components 24 by approximately 5% to approximately 13%.

Although an exerted force of 50 grams is required for optimal testing, the maximum allowable force for contacting the electronic component 24 while the test plate 22 is in motion is 20 grams. A method according to an embodiment of the invention is disclosed for applying or exerting the force needed for a reliable test connection to the electronic component only when the test plate 22 is stopped and the electronic component 24 is aligned at the test location. When the test plate 22 is in motion, a reduced force is exerted by the contact roller 12.

FIG. 2 is a flow chart of a method to test the electronic components 24 by varying the force exerted on the test plate 22 and the electronic component 24, depending on the status of the test plate and the location of the electronic component. FIGS. 3A-3B and FIGS. 4A-4B illustrates different means for accomplishing the aforementioned method.

In FIG. 3A a solenoid coil 20 is de-energized, while a preload force or first predetermined force is maintained by a spring 21 acting on the contact roller 12 against the moving test plate 22 and test component 24. During the transfer process, the test plate 22 is in motion as shown by arrow 30 carrying a plurality of electronic components 24 incrementally spaced to the station for testing. The contact roller 12 is in position as shown in FIG. 3A relative to the test plate 22, so that as an electronic component 24 reaches the test station, the contact roller 12 constantly contacts the moving test plate 22 and/or the component 24 exerting or applying a first predetermined force $F_1$ thereon. The first predetermined force $F_1$ is preloaded to prevent damage to the electronic component as the electronic component 24 moves beneath the roller contact 12 (step 32). For illustrative purposes only, the maximum allowable force for contact with respect to the electronic components 24 during motion of the plate 22 is 20 grams. Ideally it is preferred to maintain the first predetermined force $F_1$ between approximately 10 grams and approximately 20 grams, inclusive.

When the test component 24 is positioned at the test station, the test plate 22 stops. If the test plate motion is stopped (step 34) and the test component 24 is aligned in the test station (step 33) the solenoid coil is energized for applying a force causing the application of a force $F_2$ by the contact roller 12 (step 36) onto the stationary component 24 (FIG. 3B). The second predetermined force $F_2$ is preferably about 50 grams for a reliable connection of the contact roller 12 onto the electronic component 24. The second predetermined force $F_2$ is maintained on the stationary electronic component 24 during the testing procedure at the test station. (Step 38). When the test of the electronic component 24 is completed (step 40), the solenoid coil 20 de-energizes to remove the added force against the solenoid rod, and the contact roller 12 returns to the applied force $F_1$ during movement of the plate 22 to transfer another component to a ready position at the test station.

In an alternative example, the solenoid coil 20 in FIG. 3A and 3B is replaced with a fluid operated actuator, such as a pneumatic actuator 25 (FIGS. 4A, 4B) having a pair of valves or gates 26, 28 that apply different pressures to the contact roller 12. Just as in the example illustrated in FIGS. 3A and 3B, the contact roller 12 in the example shown in FIGS. 4A and 4B remains in contact with the test plate 22 and/or the test component 24.

Figure 4A:
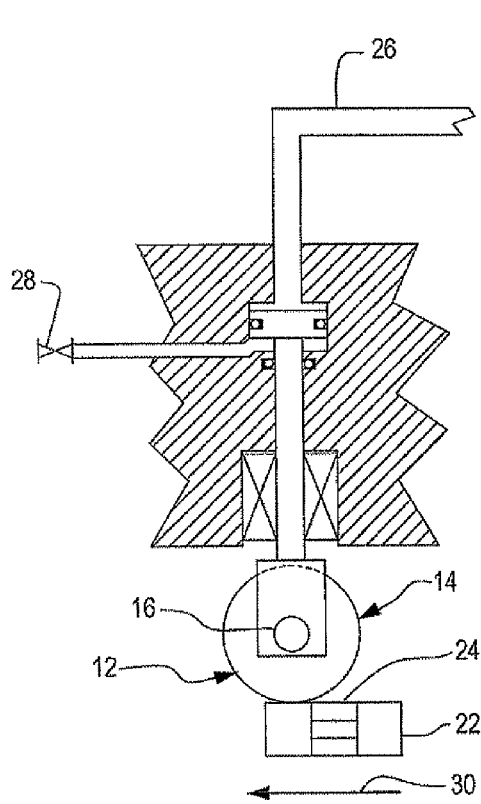
FIGS. 4A and 4B are schematic views of a contact roller at a test station according to another embodiment of the present invention with a fluid operated actuator.

In FIG. 4A, fluidic pressure in port 26 is set such that it exerts the prescribed amount of force on the electronic component 24 during stationary testing (i.e. approximately 50 grams). Gate 28 allows fluidic pressure to cancel out a portion of the force from port 26 during the motion of the test track 22 such that the contact is only exerting approximately 20 grams of force on the test tract 22 and the electronic component 24. When the test track 22 and electronic component 24 are stopped for testing, gate 28 switches to exhaust all of the fluidic pressure on the port to atmospheric pressure or negative pressure so that the fluidic pressure in port 26 exerts the proper force on the electronic component for proper testing.

Figure 4B:
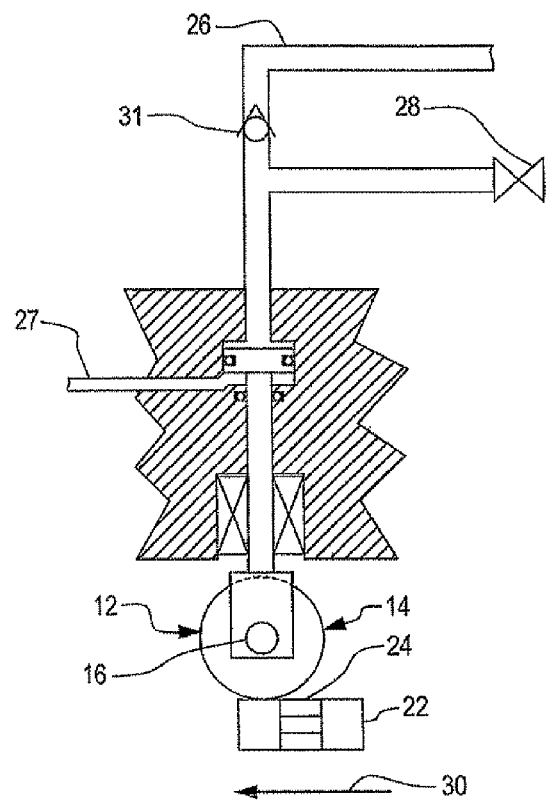

FIG. 4B is another arrangement of fluidic logic to accomplish a variable force on the electronic component. Fluidic pressure in port 26 is set such that it exerts the proper force on the contact during the motion of the test track and the electronic component. When the electronic component is ready for testing, gate 28 opens and the fluidic pressure exerts the proper force for stable electronic testing. After testing, gate 28 switches allowing the high pressure to exhaust to the lower pressure that is present in port 26. Port 27 allows the lower half of the cylinder to be open to atmospheric pressure.

In each case the contact roller 12 does not move vertically away from the test plate 22 and the electronic component 24. The contact roller 12 continuously maintains contact with the test plate 22 or electronic component 24. Only the applied force on the electronic component 24 by the contact roller 12 is changed. As a result, the impact of the contact to the test electronic component is nil and the damage to the electronic component is minimal.

Figure 5:
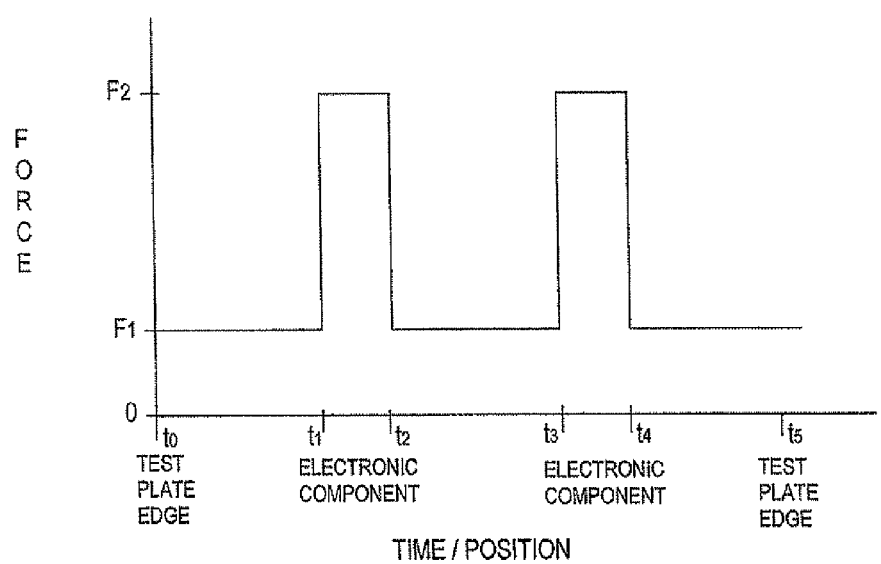
FIG. 5 is a graph of contact roller force versus time and position of the test plate and the electronic component with respect to the contact roller.

Referring now to FIG. 5, the process is illustrated graphically as force versus time/position of the contact roller 12 with respect to the test plate 22. At $t_0$, to the roller 12 contacts the edge of the test plate 22 as the plate 22 moves relative to the roller 12 to bring an electronic component 24 into a ready position for testing at time/position $t_1$. At time $t_1$, the plate movement stops and the applied force of roller 12 increases from $F_1$ to $F_2$ for the time period necessary for testing of the electronic component 24 between time $t_1$ and $t_2$. The incremental force application actuator for changing the applied force between $F_1$ and $F_2$ can be any suitable actuator, by way of example and not limitation, such as a solenoid actuator 20 (FIGS. 3A, 3B), a piezoelectric actuator 23 (FIGS. 6A, 6B), or a fluid operated actuator (FIGS. 4A, 4B). When testing is complete, at time $t_2$, the incremental force $F_2$ is removed. The force of roller 12 is returned to $F_1$ for time period $t_2$ through $t_3$ during movement of the plate 22 to position the next electronic component 24 at the ready position for testing. The testing continues as described above for testing of electronic component 24 at time $t_3$ through $t_4$ with increased incremental force $F_2$. The process repeats for the number of electronic components 24 to be tested.

Figure 6A:
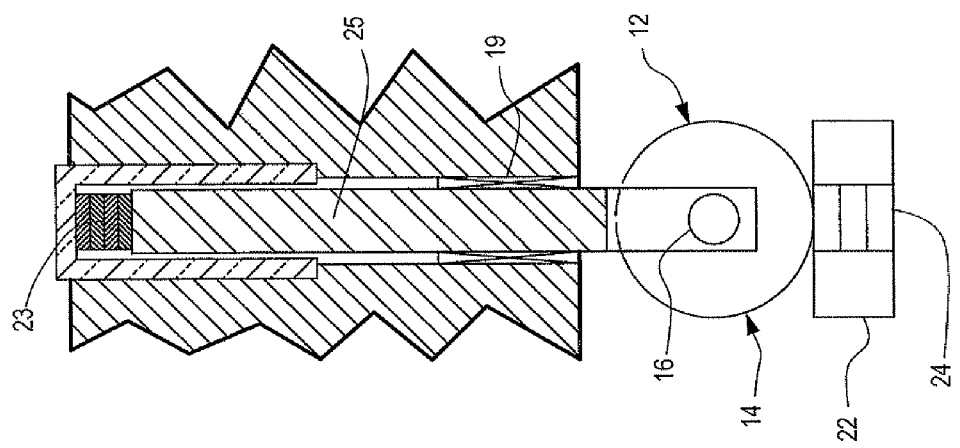
FIGS. 6A and 6B are schematic views of a contact roller at a test station according to another embodiment of the present invention with a piezoelectric actuator.
Figure 6B:
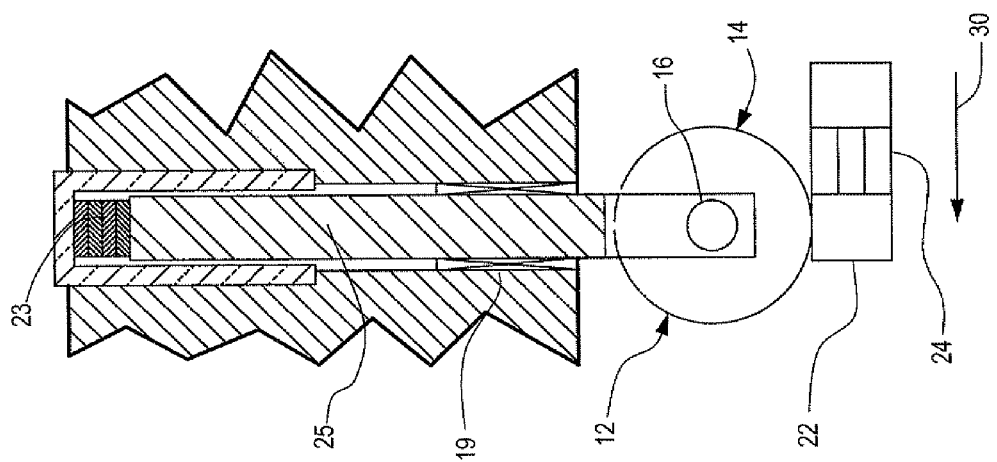

Referring now to FIGS. 6A, and 6B a piezoelectric actuator 23 is energized to a first predetermined value, to apply a first predetermined force $F_1$ on the contact roller 12 against the moving test plate 22 and test component 24. During the transfer process, the test plate 22 is in motion as shown by arrow 30 carrying a plurality of electronic components 24 incrementally spaced to the station for testing. The contact roller 12 has a circular outer rolling surface 14 and is supported on axle 16 by shaft 25 extending through guide bearing 19. During transfer movement, the contact roller 12 constantly contacts the moving test plate 22 and/or component 24 applying the first predetermined force $F_1$. When the component 24 is positioned at the test station, the test plate 22 stops. The piezoelectric actuator 23 is energized, to a second predetermined value to exert or apply a second predetermined force $F_2$ on the contact roller 12 against the stationary component 24 during the test procedure or cycle at the test station. When the test cycle is completed, the piezoelectric actuator 23 is energized to the first predetermined value again to reduce the applied force on the component 24 to the first predetermined force $F_1$ prior to starting the transfer process to transfer another component 24 to a ready position at the test station.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. In an apparatus for testing electronic components supported on a test plate for transport along a path of travel through a test station, the improvement comprising;
   a contact roller located at a test station for rolling along a surface of the test plate and at least one electronic component transported to the test station by the test plate for testing; and
   an incremental force-application actuator operable in a first mode to exert a first predetermined force through the contact roller on the test plate and supported electronic component while the test plate is moving, and operable in a second mode to exert a second predetermined force through the contact roller on the electronic component while the electronic component is stationary during testing at the test station.

2. The improvement of claim 1, wherein the incremental force-application actuator includes a pneumatic actuator selectively operable to apply the first and second predetermined forces through the contact roller.

3. The improvement of claim 1, wherein the incremental force-application actuator includes a solenoid selectively operable between an energized mode and a de-energized mode for applying the first and second predetermined forces through the contact roller.

4. The improvement of claim 1, wherein the incremental force application actuator includes a piezoelectric actuator selectively operable between a first mode and a second mode for applying the first and second predetermined forces through the contact roller.

5. In a method for testing at least one electronic component supported by a test plate for transport along a path of travel through a test station, a contact roller located at the test station for contacting the electronic component during testing, the improvement comprising:
   continuously maintaining the contact roller in contact with at least one of the test plate and the supported electronic component;
   exerting a first predetermined force with the contact roller on at least one of the test plate and the electronic component while the test plate is moving; and
   exerting a second predetermined force, greater than the first predetermined force, with the contact roller on the electronic component only when the electronic component is stationary at the test station.

6. The improvement of claim 5, wherein exerting a first predetermined force includes operating an actuator between a first mode of operation applying the first predetermined force through the contact roller and a second mode of operation applying the second predetermined force through the contact roller.

7. The improvement of claim 6, wherein operating the actuator includes energizing and de-energizing a solenoid to change between the first and second modes of operation.

8. The improvement of claim 6, wherein operating the actuator includes pressurizing a fluid operated actuator to first and second pressures to change between the first and second modes of operation.

9. The improvement of claim 5, wherein exerting the first predetermined force applies a force in a range no greater than approximately 20 grams, inclusive, and exerting the second predetermined force applies a force in a range of approximately 50 grams, inclusive.

10. A method for testing electronic components transported with a movable test plate to a test station comprising:
    exerting a first predetermined force with a contact roller against a test plate during movement of the test plate along a path of travel through a test station, at least one electronic component supported by the test plate for transport along the path of travel through the test station; and
    exerting a second predetermined force, greater than the first predetermined force, with the contact roller against a stationary electronic component supported by the test plate during testing of the stationary electronic component positioned at the test station by the test plate.

11. The method of claim 10 further comprising:
    stopping the test plate when the electronic component is located at a ready position with respect to the test station;
    testing the stationary electronic component at the ready position;
    maintaining the second predetermined force on the stationary electronic component during the test; and
    removing the second predetermined force from the at least one electronic component after the testing is completed.

12. The method of claim 11 further comprising:
    maintaining the first predetermined force on the test plate after removal of the second predetermined force; and
    moving the test plate along the path of travel through the test station.

13. The method of claim 10, wherein exerting a first predetermined force includes a force no greater than approximately 20 grams.

14. The method of claim 10, wherein exerting a first predetermined force includes exerting a force between approximately 10.0 grams and approximately 20.0 grains, inclusive.

15. The method of claim 10, wherein exerting a second predetermined force includes exerting a force of approximately 50 grams.

16. The method of claim 10 further comprising:
continuously maintaining the contact roller in contact with at least one of the test plate and the electronic component.

17. The method of claim 10 further comprising:
applying the first and second predetermined forces in response to activation of a solenoid actuator.

18. The method of claim 17 further comprising:
de-energizing the solenoid actuator for exerting the first predetermined force; and
energizing the solenoid actuator for exerting the second predetermined force.

19. The method of claim 10 further comprising:
applying the first and second predetermined forces in response to activation of a pneumatic actuator.

20. The method of claim 19 further comprising:
activating the pneumatic actuator in a first mode for exerting the first predetermined force; and
activating the pneumatic actuator in a second mode for exerting the second predetermined force.

* * * * *